United States Patent
Yang

(10) Patent No.: US 7,655,544 B2
(45) Date of Patent: Feb. 2, 2010

(54) SELF-ASSEMBLED NANOSTRUCTURES

(75) Inventor: Haeyon Yang, Logan, UT (US)

(73) Assignee: Utah State University, North Logan, UT (US)

( * ) Notice: Subject to any disclaimer, the term of this patent is extended or adjusted under 35 U.S.C. 154(b) by 255 days.

(21) Appl. No.: 11/584,892

(22) Filed: Oct. 23, 2006

(65) Prior Publication Data

US 2007/0137555 A1 Jun. 21, 2007

Related U.S. Application Data

(60) Provisional application No. 60/729,408, filed on Oct. 21, 2005.

(51) Int. Cl.
*H01L 21/20* (2006.01)
*H01L 21/36* (2006.01)

(52) U.S. Cl. ......... 438/479; 438/478; 438/487; 257/E21.251; 257/E21.252; 977/700; 977/844

(58) Field of Classification Search .......... 438/479, 438/478, 487; 257/E21.251, E21.252; 977/700, 977/844
See application file for complete search history.

(56) References Cited

U.S. PATENT DOCUMENTS

| | | | | | |
|---|---|---|---|---|---|
| 4,885,260 | A | * | 12/1989 | Ban et al. | 117/92 |
| 5,669,979 | A | * | 9/1997 | Elliott et al. | 134/1 |
| 5,757,488 | A | * | 5/1998 | Melton et al. | 356/451 |
| 5,856,961 | A | * | 1/1999 | Brazas et al. | 369/44.23 |
| 7,006,747 | B2 | * | 2/2006 | Escuti et al. | 385/132 |
| 2004/0079278 | A1 | * | 4/2004 | Kamins et al. | 117/84 |
| 2005/0095858 | A1 | * | 5/2005 | Guha et al. | 438/689 |

OTHER PUBLICATIONS

Wankert, Shcremer and Shealy; "Laser Stimulated Selective Area Growth of Quantum Dots", Applied Physics Letters, vol. 72 No. 25; Jun. 22, 1998 (pp. 3332-3334).

\* cited by examiner

*Primary Examiner*—Alexander G Ghyka
*Assistant Examiner*—Abdulfattah Mustapha

(57) ABSTRACT

Methods and apparatus for producing self-assembling quantum nanostructures by nanoheating a substrate with one or more laser interference patterns.

13 Claims, 3 Drawing Sheets

SELF-ASSEMBLED NANOSTRUCTURES

RELATED APPLICATION

This application claims the benefit of U.S. Provisional Application Ser. No. 60/729,408, filed Oct. 21, 2005, incorporated herein by reference.

TECHNICAL FIELD

The present disclosure relates generally to the field of nanotechnology. More specifically, the present disclosure relates to self-assembled quantum nanostructures.

BRIEF DESCRIPTION OF THE DRAWINGS

Understanding that drawings depict only typical embodiments of the invention and are not therefore to be considered to be limiting of its scope, the invention will be described and explained with specificity and detail through the use of the accompanying drawings as listed below.

Figure 1:
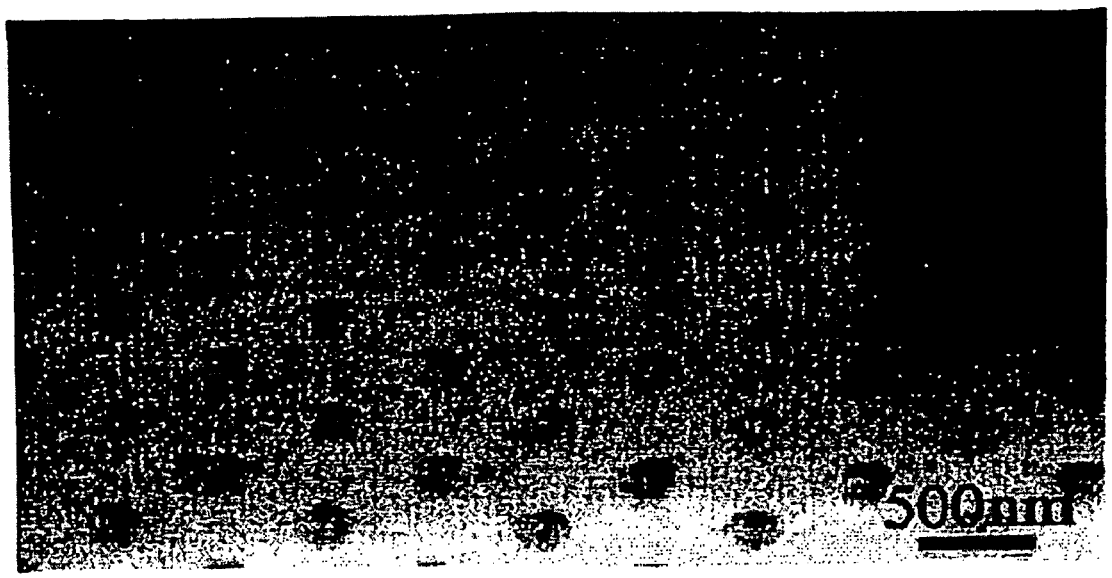
FIG. 1 is a transmission electron microscope (TEM) image of periodic arrays of patterned Co—C films.

INDEX OF ELEMENTS IDENTIFIED IN THE DRAWINGS 200 substrate
210 two-beam laser interference pattern
212 white rods
214 dark rods
220 three-beam laser interference pattern
222 white dots
224 dark dots
300 molecular beam epitaxy (MBE) growth chamber
301 laser beam splitter
302 mirrors
303 glass windows
304 substrate
310 load-lock
350 laser pulse

DETAILED DESCRIPTION OF PREFERRED EMBODIMENTS

It will be readily understood that the components of the embodiments as generally described and illustrated in the figures herein could be arranged and designed in a wide variety of different configurations. Thus, the following more detailed description of various embodiments, as represented in the figures, is not intended to limit the scope of the invention, as claimed, but is merely representative of various embodiments. While the various aspects of the embodiments are presented in drawings, the drawings are not necessarily drawn to scale unless specifically indicated.

As those of skill in the art will appreciate, the principles of the invention may be applied to and used with a variety of nanotechnologies including quantum nanodots, quantum nanowires, and other nanostructures.

With reference now to the accompanying figures, particular embodiments will now be described in greater detail. Disclosed are embodiments of methods for producing Self-Assembled Quantum Nanostructures (SAQN). In one embodiment, one or more monolayers of indium arsenide (InAs) may be grown epitaxially on a gallium arsenide (GaAs) substrate or another appropriate and desired substrate. Because of the differing lattice constants between InAs and GaAs, at a certain growth (kinetic) condition, the InAs layer may break down to form InAs dome-shaped quantum dots (QD). The breakdown thickness, or the so-called critical thickness, depends on the substrate temperature. The growth rate of a QD gets smaller as the size gets larger so that the size gets more uniform as the size of the QD gets bigger. Better uniformity may therefore be obtained by sacrificing size control. Whereas InAs and GaAs are used in the aforementioned embodiment, several alternative materials may be used. For example, layers of InAs may be deposited on an indium phosphate (InP) substrate to create various nanostructures such as nanowires. As known by those of skill in the art, InAs, GaAs, and InP are examples of semiconductor materials.

Figure 2:
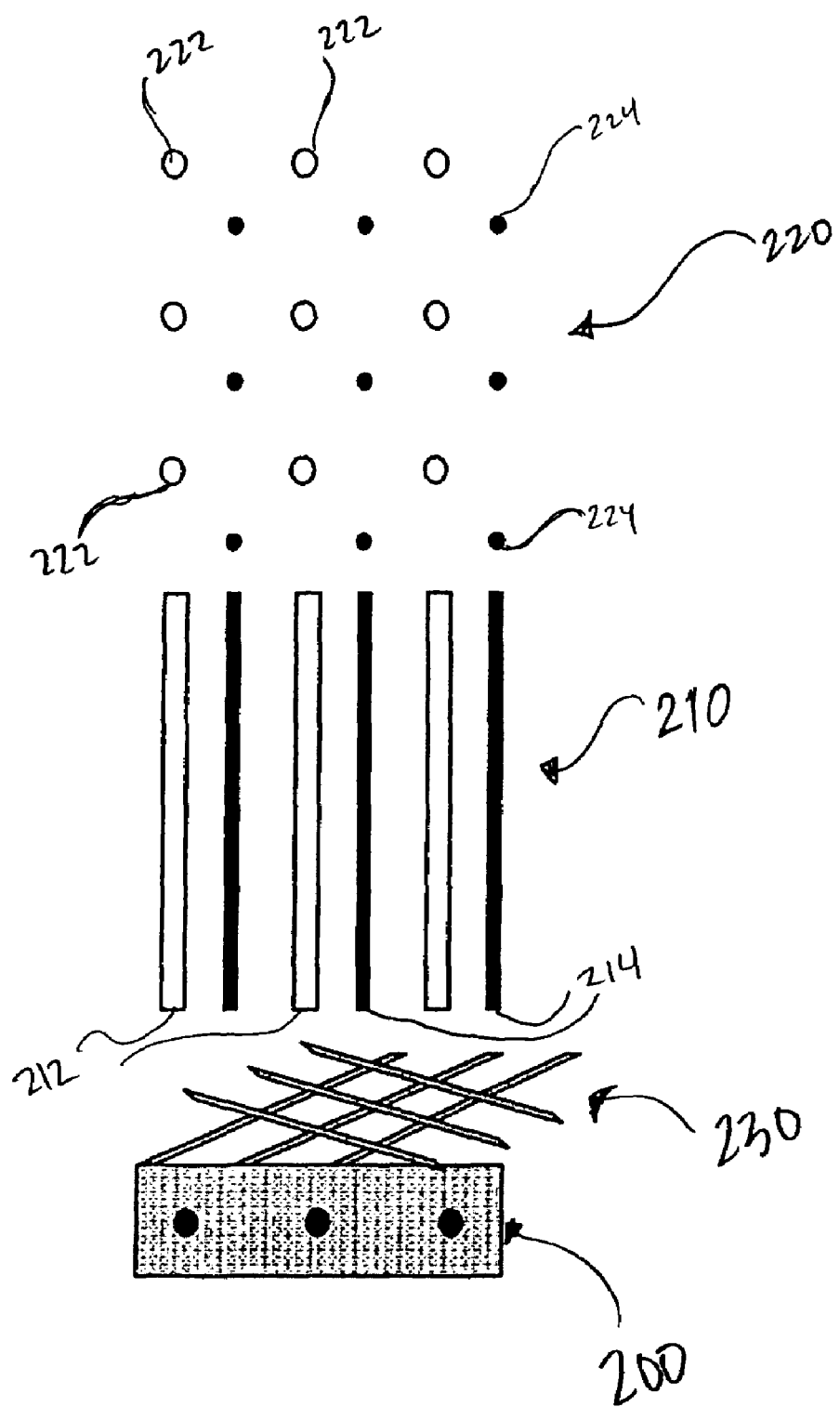
FIG. 2 is a representation of laser interference patterns and laser interference maxima.

In one embodiment, following the deposition of the InAs layer on the GaAs substrate, the material may be nanoheated by way of a laser interference pattern, which thereby creates a plurality of quantum nanostructures. The nanoheating is accomplished by the laser interference pattern of split beams from one or more high power laser pulses. As shown by FIG. 2, a two beam interference pattern 210 produces identical nano-lines. A three beam interference pattern produces an ordered array of circular/elliptical nano-dots 220 having similar sizes. The size of the lines/dots produced varies with the wavelength and intensity of the laser, and also may vary depending on the interference angle employed. A fluctuation in size of the nanoheated area and the number of resulting excited or hot atoms may be related to the power and wavelength fluctuations in the laser and in the resulting interference maxima. Because there is no diffraction effect, the power fluctuation may be very small, which results in a small fluctuation in size among the nanostructures. Other examples of InAs quantum dot formation by laser stimulation may be found in a paper by Wankerl et al., *Laser stimulated selective area growth of quantum dots*, Appl. Phys. Lett., Vol. 72, No. 25, 22 Jun. 1998, incorporated in its entirety herein by reference.

FIG. 1 is a transmission electron microscope (TEM) image of periodic arrays of patterned Co—C films. The Co—C ferromagnetic nanodots on a glass substrate are shown as dark spots, produced by an interference pattern from a pulsed laser. In FIG. 1, a thin (approximately 40 nm), amorphous film of Co—C has been co-deposited. A convergence of four laser pulses of about 308 nm at 0.17 J/cm$^2$ produced the interference pattern on the film surface shown in FIG. 1. The temperature at the interference intensity maxima was high enough to induce the phase transition from amorphous to crystalline and the dark region was suggested to have ferromagnetic properties.

Similar interference maxima can be created on epitaxial growth fronts during molecular beam epitaxy (MBE) growths, creating SAQN at the intensity maxima. To increase the SAQN density, a pattern of interference maxima can be reproduced on different locations, as shown in FIG. 2. This can be accomplished by moving the substrate. For example, a distance of approximately 50 nm between the intensity maxima of subsequent pulses can be realized by moving the substrate at approximately 0.5 µm/s with a pulse repetition rate of approximately 10 Hz. Self-assembled quantum wires (QWRs) with various widths will form when two pulses interfere.

For example, in order to increase the density of the nanostructures on a substrate the deposited semiconductor material may be pulsed with a three-beam laser interference pattern shown by the white dots 222. The substrate may then be moved and the semiconductor material pulsed again with a second three-beam laser interference pattern resulting in the dark dots 224. In yet another example, the deposited semiconductor material may be pulsed with a two-beam laser interference pattern shown by the white rods 212. The substrate may then be moved and the semiconductor material pulsed again with a second two-beam laser interference pattern resulting in the dark rods 214. More specifically, in the repetition of the laser interference patterns shown in FIG. 2, the white dots 222 and rods 212 are created from the first set of interference maxima resulting from the first laser pulse and the dark dots 224 and rods 214 are created from the second set of interference maxima resulting from the second laser pulse.

The distance between the SAQN may be controlled by adjusting the speed at which the substrate is moved. Furthermore, the size of the nanostructures may be controlled by adjusting the power and/or temperature of the laser source. For example, the sizes of the dark dots 224 and the dark rods 214 in FIG. 2 are smaller due to a lower laser power setting then that used for the production of the white dots 222 and the white rods 212. The temperature at the interference maxima can be adjusted with experimental parameters such as interference angle, power of the laser pulse, etc. In yet another example, the SAQN density may be configured to be high enough such that the edges of adjacent SAQN touch each other in some embodiments. In another embodiment, the minimum density can be lower than approximately 1 line/10 µm or $1 \times 10^7$ dots/cm$^2$ if desired.

As yet an example, various parameters can be varied to create different nanostructures, by changing the wavelength of the laser used to make the interference patterns the width or diameter of the interference maxima may also be adjusted. For example, by changing the laser wavelength to approximately 266 nm, the width or the diameter of the interference maxima of each line or spot in the embodiment shown in FIG. 1 could be approximately 133 nm. Therefore, the width or diameter of the area nanoheated would also be approximately 133 nm thus producing nanostructures of with the same dimensions. The interference maxima as used herein are the regions of maximum intensity at the point where the laser interference pattern impinges on the substrate. By controlling the dimension and intensity of the interference maxima, the number of thermally-activated atoms can be varied as desired down to zero depending on the spatial profile and/or intensity of the pulses. The time to reach thermal equilibrium with a colder substrate may be around the order of approximately 100 ns, which is much longer than the temporal pulse width. As known by those of skill in the art, it is usually those atoms near the center of the interference maxima which most contribute to form SAQN.

The interference maxima in the interference patterns created according to embodiments of the invention may have negligible power fluctuation due to the lack of diffraction. The temperature variation from one maximum to another may also be very small. The self-assembly kinetics may therefore be identical or nearly so, primarily because diffusion of mobile atoms is in nanoscale and the surrounding cold area can be viewed as a sink for the adatoms. Uniformity in the energetics of the self-assembly may be facilitated with an ultra-high-vacuum (UHV) growth condition.

The size of a SAQN can be varied by controlling the number of mobile atoms during the growth by varying the pulse intensity. SAQN size depends on the heated area in nanoscale and the substrate temperature, among other parameters. For example, in an InAs/InP QWR system, QWRs emitting/detecting either 1.3 or 1.55 µm have been created, which are important in the telecommunication industry at room temperature. By proper selection of width and height of the QWR, the QWRs can be fabricated to yield any desired wavelengths, such as those within the photoluminescent (PL) or mid-infrared (mid-IR) regions. The inter-subband transition in the conduction band of a quantum nanostructure (QN) can be used to detect mid-IR around 5 to 10 µm. The size control may be used to keep the inter-subband transition tuned to a particular wavelength in the mid-IR region. The resultant IR detector can be used as a temperature sensor in the range of, for example, 300 K to 1500 K, and can be tuned to a particular temperature.

In yet another embodiment, an angle change in the interference pattern may be used to create different QN periodicity. For example, novel 3D photonic crystals can be realized based on QNs with various periodicities. For example, a photonic crystal having a lattice constant of between 10 nm to 100 nm could be created.

Metallic nanowires (NWRs) can also be created in semiconductor thin films by use of interference maxima. For example, square or rectangular grids 230 of NWRs can be formed by 90 degree rotation of the substrate 200 of the interference pattern, such as is shown in FIG. 2. This is based on the difference in vapor pressures at a temperature above the "congruent" temperature. Ga, In, or Al metallic NWRs will be produced at the interference maxima of a two-beam interference when arsenic flux is non-existent. The width and periodicity of NWRs can be varied by adjusting various reaction parameters as discussed previously. Metallic NWRs on top of QDs and/or QWRs can act as conduits of carriers connecting those QN structures as the carriers can tunnel into and out of the metallic wire. The size can also be varied so that one QD provides information while another QD of a different size does not, depending on the applied voltages or the photon energies. This opens up the possibility to realize cellular automata based on the SAQNs.

Figure 3:
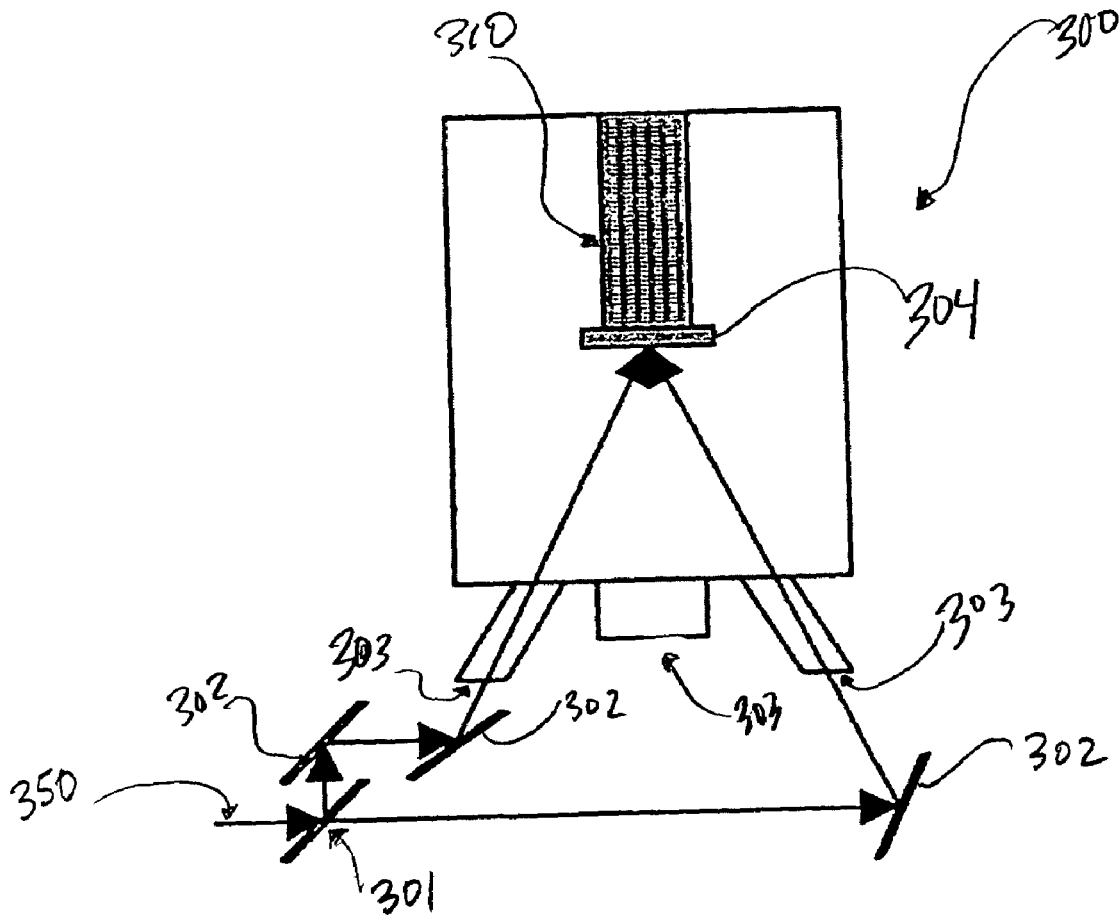
FIG. 3 is a side view of a nanoheating system.

With reference to FIG. 3, an example of a nanoheating system may include a vacuum chamber configured for epitaxially growing a semiconductor material on a substrate such as an MBE growth chamber 300. The MBE growth chamber 300 may have a load-lock 310 designed to receive a cassette holding, for example, substrate 304 wafers in an ultra-high vacuum (UHV) degas chamber with base pressure of low $10^{-10}$ torr. The base pressure of the MBE growth chamber 300 may also be at low $10^{-10}$ torr. The MBE growth chamber 300 may be equipped with source ports, upper and lower cryoshrouds for liquid nitrogen cooling, a residual gas analyzer, a flux monitor, reflection high energy electron diffraction (RHEED), and an optical temperature and film thickness measurement system—pyrometric interferometry. The centers of source ports may be approximately 36° apart, and may be approximately 33° apart from the main viewport or glass window 303 in the bottom center. A plurality of cells for solid sources such as Ga, Al, In, As, Si, and Be may be installed, in addition to a solid source P-cell if desired. Temperatures may be monitored by Eurotherm temperature controllers with temperature stability of ±0.1° C. and reproducibility of ±0.1° C. with type C thermocouples. The empty source ports, horizontal side viewports, and the center viewport at the bottom may be used as windows to introduce laser pulses into the growth chamber. The combination of all ports will produce a wide range of interference angles. An existing commercial in-situ scanning tunneling microscope (STM) may be interfaced with the MBE growth chamber 300 through the UHV degas chamber.

As previously stated, embodiments of the inventive method may start with an InAs strained layer growth on a GaAs substrate. This is to confirm the growth temperature range suitable for producing InAs self assembled quantum dots. A real-time analysis of RHEED may be used to confirm the chevron patterns appearing immediately after the nanodot formation on the GaAs substrate. The STM may be used to analyze and optimize the interference pattern and subsequent growth of ordered quantum wires and/or dots.

With reference to FIG. 3, a laser pulse 350 may be introduced into an MBE growth chamber 300 through a viewport or bottom glass windows 303 and converge on the substrate 304 disposed within the chamber 300 using a beam splitter 301 and mirrors 302 placed on an optical breadboard. A combination of all the bottom glass windows 303 and other side windows can produce variety of ordered laser interference patterns with different spot or interference maxima periodicities.

In one embodiment, a layer of strained but flat InAs may be grown on a substrate at a lower temperature than the normal growth temperature for self assembly. For example, flat InAs layers can be grown at below 400° C. In other examples, a growth temperature of InAs QD on GaAs may be approximately between 450° C. and 520° C. Laser pulses of approximately 7-10 ns can be introduced into the growth front to produce interference maxima at about 300° C. for various $As_4$ flux environments. Quantum wires or dots may be produced when the temperature of the interference maxima exceeds typical QN formation temperature, which depends on the pulse intensity, fluence, and angle. In one embodiment, for a given substrate at approximately 300° C., a temperature increase of approximately 50° C. at the interference maxima may induce QN formation at the interference maxima.

Following the application of a laser interference pattern, the quantum dot growth may be analyzed and optimized using in-situ STM and photoluminescence. Information regarding the size, shape, and periodicity of the quantum structures may be used to tune the growth conditions, such as growth temperature, III/V flux ratio, ambient gas species, and pressure. The size distribution from STM topography on laser-assisted Self-Assembled Quantum Dots (SAQD) may be correlated with the optical properties as desired.

Various embodiments for the production of self-assembling quantum nanostructures have been disclosed herein. For example, nanoheating the substrate and the deposited semiconductor material with the desired laser interference patterns are examples of means for producing self-assembling nanostructures. Furthermore, various embodiments of nanoheating systems have been disclosed herein. For example, the nanoheating system shown in FIG. 3 including a laser beam splitter, one or more mirrors, and a vacuum chamber configured to hold a substrate for epitaxial growth of a semiconductor material is an example of a means for nanoheating.

Without further elaboration, it is believed that one skilled in the art can use the preceding description to utilize the present disclosure to its fullest extent. The examples and embodiments disclosed herein are to be construed as merely illustrative and not a limitation of the scope of the present disclosure in any way. It will be apparent to those having skill in the art that changes may be made to the details of the above-described embodiments without departing from the underlying principles of the disclosure described herein. In other words, various modifications and improvements of the embodiments specifically disclosed in the description above are within the scope of the appended claims. Note that elements recited in means-plus-function format are intended to be construed in accordance with 35 U.S.C. §112 ¶6. The scope of the invention is therefore defined by the following claims.

The invention claimed is:

1. A method of producing self-assembling quantum nanostructures, the method comprising:
    depositing epitaxially on a substrate at least one layer of a semiconductor material;
    creating at least one laser interference pattern with a laser; and
    directing the at least one laser interference pattern onto the substrate thus nanoheating the deposited semiconductor material and the substrate with the laser interference pattern,
    wherein the self-assembling quantum nanostructures are produced at the maxima of the laser interference pattern.

2. The method of claim 1, wherein the laser interference pattern is a two-beam interference pattern.

3. The method of claim 1, wherein the laser interference pattern is a three-beam interference pattern.

4. The method of claim 1, wherein the substrate is GaAs or InP or combinations thereof.

5. The method of claim 1, wherein the deposited semiconductor material is InAs, GaAs, or InP or a combination thereof.

6. The method of claim 1, further comprising:
    moving the substrate relative to the laser interference pattern after nanoheating the deposited semiconductor material and the substrate;
    repeating the nanoheating of the deposited semiconductor material and the substrate with the laser interference pattern after moving the substrate; and
    thus increasing the density of the self-assembling quantum nanostructures on the substrate.

7. The method of claim 6, further comprising modifying the laser interference pattern by adjusting the wavelength of the laser.

8. The method of claim 1, wherein the produced self-assembling quantum nanostructures are quantum nanodots, quantum nanowires, or 3D photonic crystals or combinations thereof.

9. A method of nanoheating a substrate, the method comprising:
    creating a laser interference pattern;
    directing the laser interference pattern onto the substrate; and
    nanoheating the substrate at the laser interference pattern maxima.

10. The method of claim 9, wherein the laser interference pattern is a two-beam interference pattern.

11. The method of claim 9, wherein the laser interference pattern is a three-beam interference pattern.

12. The method of claim 9, wherein the laser interference pattern is created by using a laser with a wavelength of from approximately 300 nm to approximately 150 nm.

13. The method of claim 9, wherein the laser interference pattern maxima comprises a temperature approximately between 450° C. and 520° C.

* * * * *